(12) United States Patent
Kloeppel (10) Patent No.: US 9,175,383 B2
(45) Date of Patent: Nov. 3, 2015

(54) DOUBLE-COATING DEVICE WITH ONE PROCESS CHAMBER

(75) Inventor: Andreas Kloeppel, Glauburg (DE)

(73) Assignee: APPLIED MATERIALS, INC., Santa Clara, CA (US)

( * ) Notice: Subject to any disclaimer, the term of this patent is extended or adjusted under 35 U.S.C. 154(b) by 1134 days.

(21) Appl. No.: 12/015,249

(22) Filed: Jan. 16, 2008

(65) Prior Publication Data

US 2009/0178916 A1    Jul. 16, 2009

(51) Int. Cl.
*C23C 14/34* (2006.01)
*C23C 14/35* (2006.01)
*H01J 37/34* (2006.01)

(52) U.S. Cl.
CPC ............... *C23C 14/352* (2013.01); *H01J 37/34* (2013.01); *H01J 37/3405* (2013.01)

(58) Field of Classification Search
CPC ..... C23C 14/352; H01J 37/34; H01J 37/3405
USPC ............ 204/192.12, 298.21, 298.23, 298.24, 204/298.07
See application file for complete search history.

(56) References Cited

U.S. PATENT DOCUMENTS 2,257,411 A * 9/1941 Berghaus et al. ........ 204/192.12
3,616,402 A * 10/1971 Kumagai ................. 204/192.12

(Continued)

FOREIGN PATENT DOCUMENTS

DE    4126236 C2    1/2000
DE    4418906 B4    3/2004

(Continued)

OTHER PUBLICATIONS

Machine Translation to Nishiki (JP 2003-096561) published Apr. 2003.*

Machine Translation to Nishiki (JP 2003-183823) published Jul. 2003.*

(Continued)

*Primary Examiner* — John Brayton
(74) *Attorney, Agent, or Firm* — Kilpatrick Townsend & Stockton LLP (57) ABSTRACT

The invention refers to a coating device for the deposition of thin films on large area substrates comprising a process chamber, an electrode arrangement within the process chamber (2) which is adapted for generating a plasma adjacent to the electrode arrangement (4) at at least two opposing sides of the electrode arrangement, and at least two substrate holders for supporting at least two substrates (5,6) in substrate positions on opposing sides of the electrode arrangement, the electrode arrangement being located between the substrate positions and the substrates facing in the substrate positions the at least two plasma generated at the electrode arrangement, wherein the electrode arrangement comprises at least two cathodes arranged in a plane, the cathodes being able to generate a plasma at at least two sides of each cathode. The invention further refers to a method for coating substrates with thin films comprising the following steps:
providing a process chamber,
providing an electrode arrangement within the process chamber for generating a plasma adjacent to the electrode arrangement at at least two sides of the electrode arrangement, and providing at least two substrate holders for supporting at least a first and a second substrate, locating the substrates to be coated in first and second positions on opposing sides of the electrode arrangement so that the electrode arrangement is located between the first and second positions and the substrates facing the at least two plasma generated at the electrode arrangement, wherein a first substrate located in the first substrate holder is coated in the first position during a first coating process and a second substrate supported by the second substrate holder is coated in the second position during a second coating process, the first and second coating process are carried out one after the other.

23 Claims, 7 Drawing Sheets

(56) References Cited

U.S. PATENT DOCUMENTS

| | | | |
|---|---|---|---|
| 4,466,876 A * | 8/1984 | Sakai et al. | 204/298.07 |
| 4,486,289 A | 12/1984 | Parsons et al. | |
| 4,851,095 A * | 7/1989 | Scobey et al. | 204/192.12 |
| 4,871,434 A * | 10/1989 | Munz et al. | 204/192.16 |
| 5,158,660 A * | 10/1992 | Devigne et al. | 204/298.21 |
| 5,683,561 A * | 11/1997 | Hollars et al. | 204/298.25 |
| 5,814,195 A * | 9/1998 | Lehan et al. | 204/192.12 |
| 6,365,010 B1 * | 4/2002 | Hollars | 204/192.12 |
| 6,620,299 B1 | 9/2003 | Fietzke et al. | |
| 7,157,123 B2 | 1/2007 | Hartig | |
| 2005/0034975 A1 | 2/2005 | Haag et al. | |
| 2005/0252768 A1* | 11/2005 | Bangert et al. | 204/298.21 |
| 2006/0225997 A1* | 10/2006 | Liu | 204/192.1 |
| 2007/0056844 A1* | 3/2007 | Heimel | 204/192.1 |

FOREIGN PATENT DOCUMENTS

| | | | |
|---|---|---|---|
| EP | 05508612 A | | 10/1992 |
| EP | 0537011 B1 | | 7/1998 |
| EP | 1594153 A1 | | 11/2005 |
| EP | 1650324 A2 | | 4/2006 |
| GB | 1391842 A | | 4/1975 |
| GB | 2331768 A | | 6/1999 |
| JP | 59177373 A | | 10/1984 |
| JP | 62096671 A | | 5/1987 |
| JP | 2003096561 A | * | 4/2003 |
| JP | 2003183823 A | * | 7/2003 |
| JP | 2004027272 A | | 1/2004 |
| WO | WO 2007/051105 A2 | | 5/2007 |

OTHER PUBLICATIONS

Wright, Michael et al., "Design advances and applications of the rotatable cylindrical magnetron", J. Vac. Sci. Technol. A 4 (3), May/Jun. 1986, p. 388-392.

* cited by examiner

DOUBLE-COATING DEVICE WITH ONE PROCESS CHAMBER

BACKGROUND OF THE INVENTION

1. Field of the Invention

The present invention refers to a coating device for the deposition of thin films on especially large-area substrates, like architectural glass or display panels. Furthermore, the present invention refers to a method for coating such substrates.

2. Prior Art

Coating devices for coating of especially thin layers on substrates like glass are widely used in industrial applications, e.g. depositing of heat insulation layers on architectural glass or conductive or semiconducting layers on display panels or photovoltaic units.

In order to apply such thin films on large-area substrates, devices and methods are known from prior art. However, a permanent need for improvement exists with respect to an increase of homogeneity of layer thickness or other properties of the deposited layers over the whole coated substrate as well as an enhancement of efficiency of coating.

Since it is always difficult to find an appropriate comprise to achieve these diverging needs, an improvement in this respect is especially valuable.

From prior art sputter processes are known for carrying out coating processes mentioned above.

Figure 9:
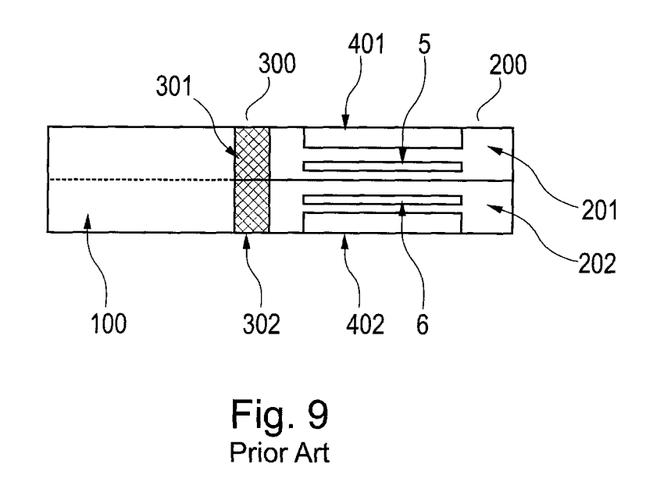

As can be seen from FIG. 9 showing a prior art apparatus, sputter devices have an electrode arrangement 401, 402 within a process chamber 201, 202 in order to ignite a plasma and accelerate ions of the plasma towards a target in front of a cathode of the electrode arrangement 401, 402. Magnetron cathodes comprise a magnet arrangement, which is disposed behind the target so as to lead to a confinement of electrons in front of the target and thus to a plasma concentration in this area. Thus, a high sputter yield is achieved due to the high concentration of ions impinging on the target. The material of the target is atomized and deposits on the substrate 5, 6 being disposed opposing to the magnetron cathode.

In order to achieve a high through-put of the device, a double-chamber design can be used with two process chambers 201, 202 arranged side by side to each other. Such a double-chamber 200 enables a production of the process chambers with reduced effort and allows a space saving design of the sputter apparatus. According to the embodiment shown in FIG. 9, a buffer chamber 100 for storing the substrates to be coated and a lock section 300 having two locks 301 and 301 for feeding the substrates into both process chambers 201, 202 are additionally provided for.

DE 41 26 236 C2 also describes a device for a sputter process. This device comprises a rotating magnetron cathode having a hollow cylinder target, which rotates in order to use the whole target surface for sputtering.

According to DE 41 26 236 C2 two magnet arrangements are disposed in the hollow cylinder target so as to form two plasma areas on opposing sides of the cylindrical magnetron electrode. One plasma is used for coating the substrate, the second plasma generated by the second magnet arrangement is used for cleaning of the rotating target. However, it is also possible to simultaneously deposit layers on two substrates being located at the opposing sides of the cathode. This device can however only be used for small-area coatings or a dynamic coating process wherein the substrates are passing the single sputter source.

A similar device is disclosed in U.S. Pat. No. 5,158,660. However, instead of a magnet arrangement inside the cylindrical electrode, a magnet arrangement disposed outside the target or cathode is used. However, this device of U.S. Pat. No. 5,158,660 is also a single coating source with small lateral dimensions for small-area coatings or dynamic coating processes.

In order to achieve large-area coatings with homogenous layer thicknesses, EP 15 94 153 A1 suggests to provide a plurality of cathodes in order to allow stationary coating of large-area substrate facing the plurality of cathodes. However, in order to be sure that at the margins of the substrates the same layer thickness is achieved as in the central area, the cathodes of EP 15 93 153 A1 are arranged at a curved surface. Accordingly, it is not possible to use cathodes described in DE 41 26 236 C2 or U.S. Pat. No. 5,158,660 having deposition areas on two sides of the cathodes, since the curved arrangement of the cathode does not allow homogenous twin-deposition from two sides of the cathode.

Other devices, e.g. described in WO 2007/051105 A2 or JP 2004 027 272 A, deal with the above-mentioned problems by providing movable magnet arrangements for magnetron electrodes. Although, this leads to an improved material usage of target material and allows for adapted deposition areas leading to an enhancement of layer homogeneity, improvements with respect to layer homogeneity of large-area depositions and improvements with respect to efficiency are still necessary.

DISCLOSURE OF THE INVENTION

Object of the Invention

It is therefore an object of the present invention to provide a device as well as a method for the deposition of thin films on especially large-area substrates which allows for deposition of layers with high homogenity with respect to layer thickness and other layer properties, while at the same time high efficiency in deposition is reached. Furthermore, the device should be easy to manufacture and the method should be easy to perform.

Technical Solution

These and other objects are achieved by a coating device having the features of claim 1 or claim 22 as well as a method having the features of claim 23. Advantageous embodiments are subject matter of the dependant claims.

According to the invention homogenous thin layers can be deposited on especially large-area substrates in an efficient manner when an electrode arrangement is used which allows for generating of plasma at at least two opposing sides of the electrode arrangement. Accordingly, two substrate positions on opposing sides of the electrode arrangement can be provided at which the substrates can be coated under the support of the plasma generated by the single electrode arrangement. The substrate positions may also be designated as coating positions. Due to the provision of at least two substrate positions for coating in connection with only one electrode arrangement, the efficiency of such a device or of a coating method carried out in such a device is strongly increased.

In order to achieve homogeneity for large-area layers, especially for layers deposited by stationary coating where the substrate is in a fixed, stationary state with respect to the coating source, at least two cathodes, preferably a plurality of at least three cathodes or more cathodes are arranged in the electrode arrangement in a plane. Accordingly, several coating sources are arranged side by side in a linear row so as to cover a large coating area. Although, EP 15 94 153 A1 teaches to align a plurality of electrodes along a curved surface, the invention has proved that an arrangement in a plane, which allows for a high efficiency design with at least two deposition positions, also enables excellent results with respect to homogeneity of the deposited layers and their properties.

The electrode arrangement may comprise 3, 4, 5, 6, 7, 8, 9, 10, 11 or 12 or even more cathodes arranged in a plane. In particular, an even number of cathodes can be arranged in a plane. This is advantageous, if the cathodes are operated alternately as cathodes and anodes by applying alternating voltage (AC) and/or pulsed voltage (pulsed DC). If an even number of cathodes is used, these cathodes can be connected by pairs to form alternate anode-cathode-pairs.

In order to achieve a large deposition or coating area, cathodes having an elongated shape can be used. An elongated shape may be defined by the ratio of length to width of the electrode. For example, the length of the cathodes may be more than three times the extension in a direction across thereof, i.e. the width or thickness.

Preferably, the cathodes being arranged side by side in the electrode arrangement can be arranged in parallel to each other along the length direction. This allows for good coverage of the deposition area.

The distances between adjacent cathodes may not be equal for all pairs of proximate or adjacent cathodes. Thus, it is possible to select the positions of the cathodes within the plane of arrangement as required by the specific circumstances of the coating process to be applied in order to achieve homogenous layer properties over the whole coated substrate.

Thus, the distances between cathodes of outer pairs of proximate cathodes of the electrode arrangement may be smaller than the distances between cathodes of inner pairs of cathodes of the electrode arrangement so that homogeneity e.g. with respect to layer thickness is also achieved at the margin of the substrates to be coated. Since at the margin of the substrate or the coating area less coating material is available, a smaller distance between the pairs of adjacent cathodes or targets, respectively, in the outer area provides more coating material and solves this problem.

Accordingly, the cathodes can be disposed movable within the electrode arrangement. In addition to all kind of movements within the plane of arrangement, a translational slide in the plane of arrangement is preferred.

Although stationary coating of large area substrates has been described as advantageous for the inventive device or method, dynamic coating with moving substrates is also possible.

Moreover, various coating or deposition processes may be carried out with the inventive device or according to the inventive method, although sputter deposition is especially advantageous with such a device or method.

Accordingly, the electrode arrangement may be configured to comprise various features necessary for carrying out different coating processes.

For example, the electrode arrangement may also comprise anodes, if the cathodes are not alternately used as cathodes and anodes of twin-magnetrons to which RF-power is applied as described above.

Different forms of electrodes are usable with the present invention as well. In one preferred embodiment, magnetron electrodes with at least one magnet arrangement being associated to the electrode may be used together with a target material to be atomized. In particular, the magnetron cathodes may comprise a rotatable cylindrical target and/or a rotatable magnet arrangement, in order to improve material usage with respect to the target material and user-defined alignment of the deposition area.

With a rotatable magnet arrangement, the sputter and deposition direction can be influenced and adjusted to the specific coating requirement. Accordingly, flattening the film uniformity of the deposited layer is possible.

A rotatable magnet arrangement is also advantageous with respect to the at least two coating areas on opposing sides of the cathode or electrode arrangement, respectively. In this respect an asymmetric magnet arrangement, which in particular provides only plasma for one or a part of the possible coating positions, may be used. For example, for a design with two coating positions a magnet arrangement only generating a single plasma area may be used. This magnet arrangement is rotated or pivoted such that the plasma is alternately generated at one of the coating positions. This is especially advantageous with respect to successive coating processes carried out at at least two coating areas as described below.

In other embodiments other kinds of a rotatable asymmetric magnet arrangement being asymmetric with respect to the swivel or rotation axis may be used. If at least two different magnet arrangements for each coating side of the cathode or a twin- or multiple-magnet arrangement with two or more different halves or parts is used, different deposition conditions may be set at the various coating positions. Due to the rotatable design of the magnet arrangement the different parts of the magnet arrangement can be associated to all coating positions. However, an asymmetric design of the magnet arrangement may also be conceivable for fixed magnet arrangements having no rotation option.

The inventive device can be used in different ways.

First of all, simultaneous coating of at least two substrates at the at least two coating positions is possible. The number of substrates, which can be coated simultaneously, refers to the number of coating positions or the number of sides of the electrodes, where a plasma can be generated. With an asymmetric magnet arrangement different coatings can be achieved at the substrates located in the various coating positions.

Secondly, single coating processes can be formed alternately at the different coating positions. For example, if a rotatable asymmetric magnet arrangement with only one plasma generating means is provided for, a plasma can only be generated at one side of the cathode so that the coating area is changed by rotating or pivoting the asymmetric magnet arrangement from one coating position to another. Accordingly, the coating area can pivot between the first and the second side of the electrode arrangement or additional sides and the coating may be carried out one after the other in the different coating positions. In this case the efficiency of the coating device is improved, since during time without coating, substrates to be coated can be supplied to and/or removed from the substrate positions not used for coating.

Successive coating of substrates in the different substrate positions can be performed such that different substrates are coated and/or the same substrate is provided with different layers. Thus, a substrate provided with a first layer at a first coating position can be provided with a second, different layer at the second substrate position.

Since according to the present invention only one electrode arrangement is used in a single process chamber for at least two coating stages or positions, a lot of equipment for the coating device can be saved. For example, it is possible to have only one gas supply for supplying process and/or reactive gas to the process chamber for the deposition processes. Further, control means for only one electrode arrangement has to be provided. Other components like locks for locking-in and/or removing the substrates into and/or out of the process chamber can also be reduced in number. Similarly, material usage and equipment for providing transport means for the substrates etc. can also be reduced.

SHORT DESCRIPTION OF THE FIGURES

Further advantages, features and characteristics of the present invention become apparent from the following detailed description of preferred embodiments of the invention with respect to the attached drawings. The drawings show in pure schematic manner in FIG. 1 a top view on a part of an embodiment of an inventive coating device.

Figure 1:
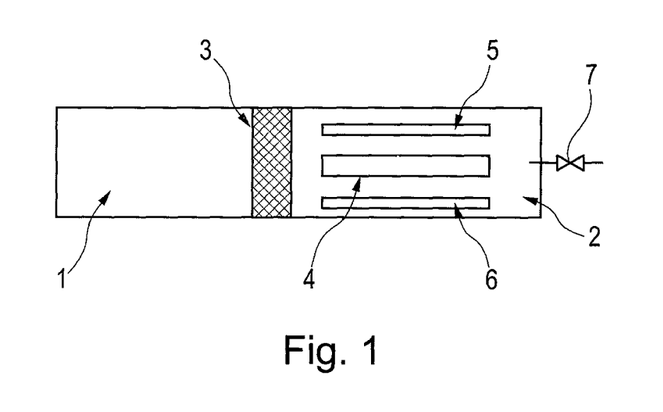

In FIG. 1 the basic design of an inventive coating device is shown. The coating device comprises a buffer chamber 1 and a process chamber 2, which are separated by a lock section 3.

The buffer chamber 1 is used to store substrates 5, 6 to be coated. The buffer chamber 1 may also be used for pre-evacuating so that the pressure difference between the buffer chamber 1 and the process chamber 2 is reduced.

The coating device shown in FIG. 1 is designed for sputter depositing of thin layers. During sputtering a plasma is used to generate ions which are accelerated towards a target being located in front of a cathode of an electrode arrangement. Due to the impinging ions, material of the target is atomized and this atomized material of the target is deposited on the substrates 5 and 6. Other plasma based coating processes can be performed by the inventive device or method as well, e.g. plasma enhanced chemical vapour deposition (PECVD).

The process chamber 2 of the device shown in FIG. 1 comprises an electrode arrangement 4 which is located in the centre of the process chamber 2. At two sides of the electrode arrangement 4 substrate positions are provided for in which the substrates 5 and 6 can be located for coating. The central electrode arrangement 4 is enabling the deposition process at the substrates 5 and 6 by generating a plasma associated with the substrate positions shown by the substrates 5 and 6 in FIG. 1 at both sides of the electrode arrangement 4.

For generating the plasma a process gas providing the ions for the plasma has to be present in the process chamber. In addition a reactive gas for reactive sputtering may be introduced into the process chamber 2. In order to introduce gas into the process chamber 2, a gas supply 7 is provided for. Since the substrates 5 and 6 are coated in one single process chamber 2, it is sufficient to have one common gas supply 7, which can be used for both deposition processes of both substrates 5 and 6.

The electrode arrangement 4 can be of various designs and all designs known to a man skilled in the art which can be used with the present invention are conceivable.

Figure 10:
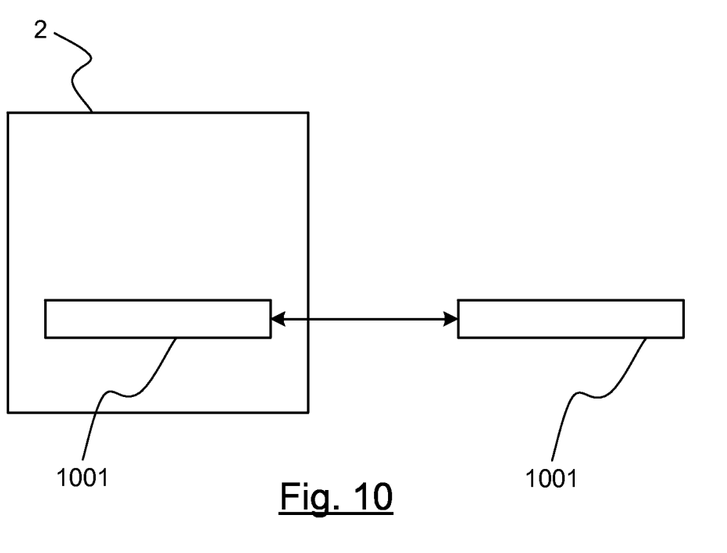
FIG. 10 is a block diagram representation of a movable substrate holder in relation to a process chamber.

The substrates 5 and 6 are supported by a substrate holder 1001 (shown in FIG. 10). The substrate holder 1001 may be movable so that the substrate holder 1001 can also be used for transporting the substrates into the process chamber 2 and out of the process chamber 2. In this case the substrate holder 1001 may also be named "carrier". However, it is also conceivable that additional transporting means are provided for transporting the substrates 5, 6 into the process chamber 2 and/or out of the process chamber 2 as well as within the process chamber.

The transporting means used for carrying the substrates 5, 6 into, out of and/or within the process chamber 2 may be designed such that they at least in parts can be used for all substrates or some of them simultaneously. Accordingly, the investment in transporting means can be reduced.

As mentioned above, the substrate holder and the carrier for transporting the substrate may be identical. However, substrate holder and carrier may be formed as separate components, especially in the case of stationary coating, wherein during coating the substrates 5, 6 are located in stationary substrate holders (not shown).

Accordingly, the coating of the substrates 5, 6 can be carried out while the substrates 5, 6 are stationary with respect to the electrode arrangement 4. However, it is also possible that the substrates pass along the electrode arrangement 4 during coating so that not stationary coating but dynamic coating is performed. It depends on specific requirements which kind of coating is preferred. However, the present invention may be especially advantageous for stationary coating of large-area flat panel substrates, like architectural glass or display panels.

Between the buffer chamber 1 and the process chamber 3 a lock section 3 is disposed. The lock section 3 serves for locking in the substrates from the buffer chamber 1 to the process chamber 2 and/or vice versa.

The lock section 3 may comprise only one lock, but may also have two or several locks in order to reduce locking-time.

As can be seen from FIG. 1, according to the basic design of the inventive coating device the process chamber comprises only one central electrode arrangement, but two substrate positions at two opposing sides of the electrode arrangement 4, in which the substrates 5 and 6 are treated or coated, respectively. Although, the substrates 5 and 6 may be locked-in into the process chamber 2, one after the other through one lock, it may be advantageous to have two locks for simultaneously locking-in of the substrates 5 and 6 in order to reduce locking-in time. However, if the substrates 5 and 6 are not processed simultaneously, it might be sufficient to have only one lock in the lock section 3, since one of the substrates can be brought into the process chamber or removed from the process chamber 2, while the other substrate is processed. In this case an additional, non-permanent partition may be provided in order to separate the coating positions and/or the lock areas.

The flat, large area substrates to be used with the present invention normally have a rectangular or a square main surface or a cuboid-like shape with an extension in at least one direction of more than one meter.

The device of FIG. 1 is shown in a top view so that the substrates 5, 6 and the electrode arrangement 4 are seen from above. From this it becomes clear, that the substrates 5, 6 are arranged in an upright manner with an almost vertical alignment. Normally, the main plane of the substrates 5, 6 which is parallel to the main surface of the substrates 5, 6 is oriented within ±25° to the vertical direction.

Accordingly, the electrodes of the electrode arrangement 4 which are supported at the bottom of the process chamber are also standing in an upright position. The length direction of the electrodes of the electrode arrangement 4 is almost parallel to the vertical direction within a deviation of about ±25° to the vertical direction, too.

Instead of the design shown in FIG. 1 with an upright position of the substrates 5, 6 as well as of the electrodes of the electrode arrangement 4, it is also conceivable to arrange the electrode arrangement in a horizontal direction so that the substrates 5, 6 are also aligned horizontally during deposition. In this case, coating occurs from up to down and vice versa due to the two substrate positions on the opposing sides of the electrode arrangement 4. In the horizontal design, the electrodes of the electrode arrangement 4 may be attached to a sidewall of the process chamber 2 or any auxiliary mounting element in a cantilevered manner.

Figure 2:
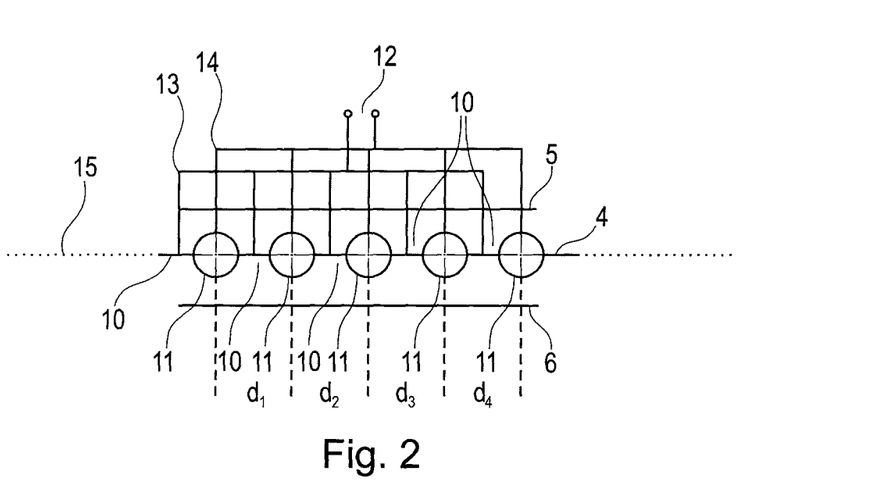
FIG. 2 details of the embodiment shown in FIG. 1.

FIG. 2 disclosed a detailed illustration of an electrode arrangement which can be used with the device of FIG. 1 or generally with the invention.

The electrode arrangement 4 of FIG. 2 comprises five anodes 10 and five cathodes 11 which are arranged alternately one after the other in a plane 15. The length elongation is perpendicular to the plotting plane. While the anodes 10 are flat planar electrodes, the cathodes 11 have a cylindrical shape, from which only the circular cross-section can be seen in FIG. 2. The anodes 10 are connected to each other by a conductor 13, while the cathodes 11 are connected electrically to each other by a conductor 14. The conductors 13 and 14 are connected to a power supply 12 which may provide different forms of electrical power, like DC, AC or RF (radio frequency) or microwave power.

The cathodes 11 are disposed at a distance to each other measured from the centre of each cathode 11. The distance between the cathodes 11 is designated by $d_1$, $d_2$, $d_3$ and $d_4$. In order to achieve a homogenous and flat deposition layer on the substrates 5 and 6, the distances $d_1$ to $d_4$ may be different. In particular, the cathodes 11 are arranged movably or slidably in the plane 15 so as to be able to adapt the distances $d_1$ to $d_4$ to the coating requirements.

Preferably, the distances $d_1$ and $d_4$ may be smaller than the distances $d_2$ and $d_3$ so that sufficient coating material can be supplied at the margin of substrates 5 and 6.

Figure 8:
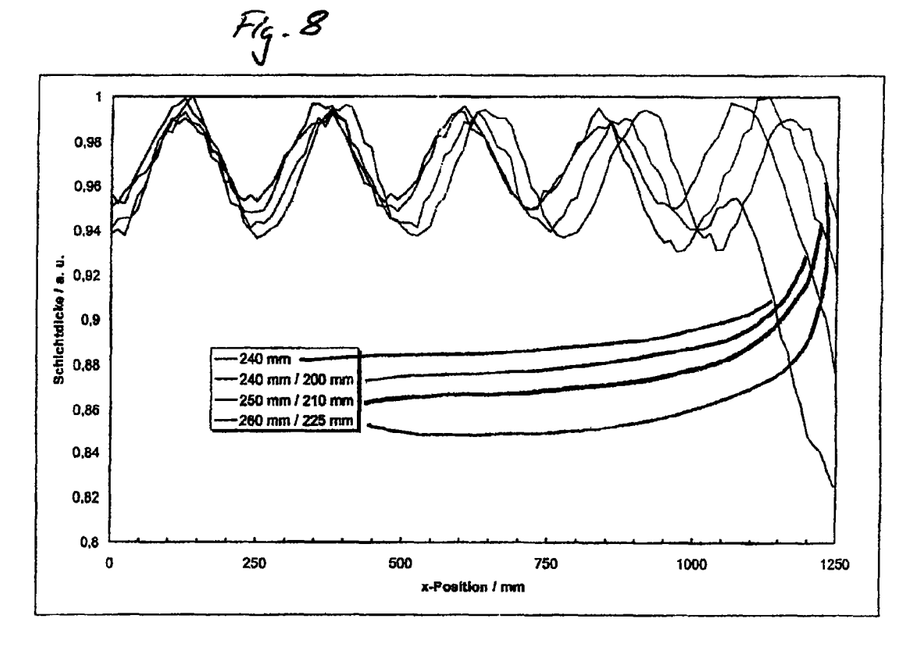
FIG. 8 a diagram showing the variation of layer thickness along the x-direction of the substrate in dependence of the distance of the cathodes within the electrode arrangement used for deposition of the layer; and in FIG. 9 a comparative illustration of a prior art coating device.

As can be seen in the diagram of FIG. 8, a reduction of the cathode distance in the outer pairs of adjacent cathodes 11, i.e. the distances $d_1$ and $d_4$, leads to an improved layer thickness with respect to homogeneity of layer thickness compared to an equidistant arrangement of the electrodes 10, 11 in the electrode arrangement 4. Further, as can be also seen in FIG. 8, the best result is achieved by an increased distance for the inner pairs of cathodes, namely the distances $d_2$ and $d_3$, and only a minor reduction of the distances $d_1$ and $d_4$. Thus, by a movable arrangement of the cathodes 11, the best distribution of cathodes or electrodes in the plane can be set up in order to achieve a homogenous and uniform coating.

Figure 3:
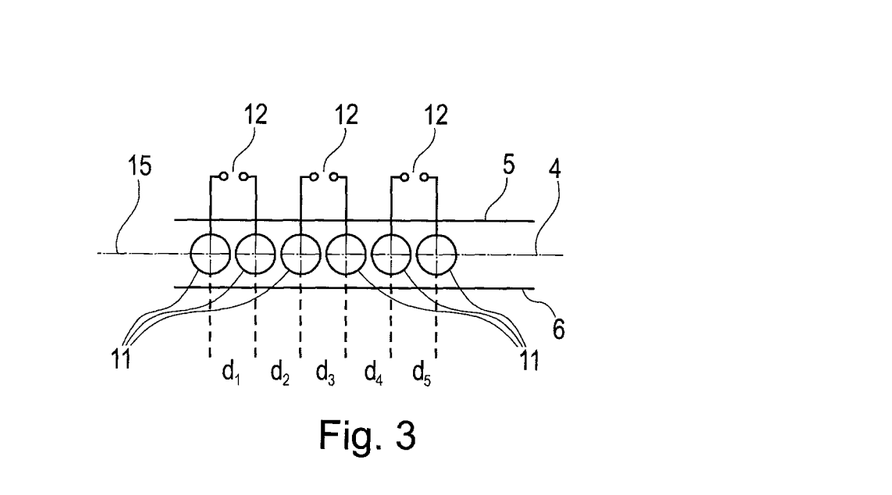
FIG. 3 another detailed illustration similar to FIG. 2 showing an alternative embodiment.

FIG. 3 discloses an alternative embodiment of an electrode arrangement 4 without additional anodes. Instead of anodes, the cathodes 11 are operated alternately as anode and cathode. Accordingly, pairs of cathodes 11 can be operated as twin-electrodes, each pair of electrodes being connected to an own power supply 12, which may for example provide AC- or RF-power.

The distances $d_1$ to $d_5$ of the cathodes 11 of the embodiment of FIG. 3 may also be adjusted to the specific coating requirement similar to the electrode arrangement shown in FIG. 2. For this reason, the cathodes 11 may also be movable and/or slidable. Further, the cathodes 11 are also arranged along a plane 15 in order to achieve constant distance of the electrodes to the substrates 5 and 6 over the whole extension of the substrates 5 and 6. The distances from the cathodes 11 to the substrates 5 and 6 can however be different for both substrates 5, 6 in both embodiments of FIGS. 2 and 3. Thus, the substrate 5 can be arranged in a greater distance to the cathode 11 than the substrate 6 or vice versa. In order to achieve the different distances of the substrates 5, 6 to the electrode arrangement 4, the substrate holders (not shown) are also movable in the direction to the electrode arrangement 4.

Figure 4:
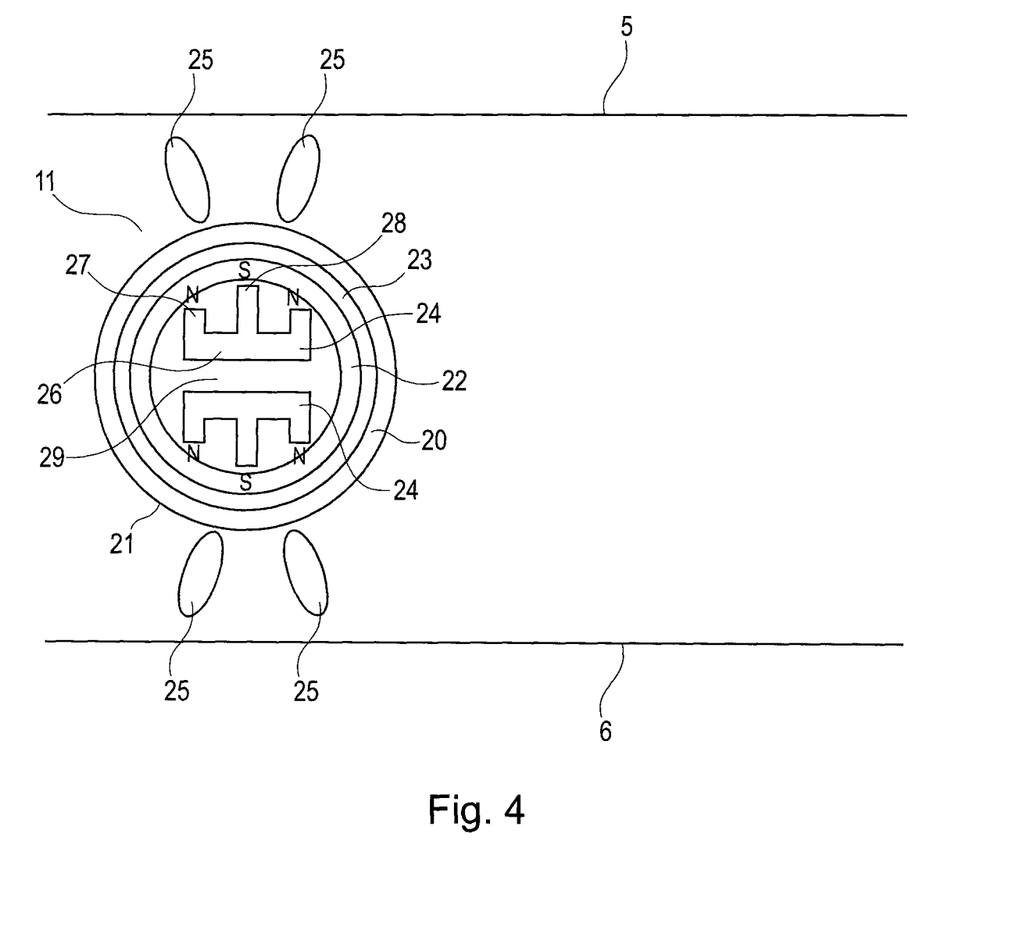
FIG. 4 a detailed illustration of a magnetron cathode which can be used with the present invention.

In FIG. 4 a detailed illustration of cathode 11 which may be used with the embodiments shown in FIGS. 2 and 3 is shown. FIG. 4 is a cross-section through the cathode 11 of FIG. 2 or FIG. 3 along a horizontal plane, i.e. a plane parallel to the plotting plane.

The cathode 11 comprises a so-called backing-tube 20 which serves as the electrode which is connected to the power-supply. The backing-tube is a cylindrical, metallic tube, on which a cylindrical target 21 is disposed.

In the backing-tube 20, a copper-tube 22 is co-axially arranged at a distance to the backing-tube 20. Due to the distance of the copper-tube 22 to the backing-tube 20, a space is defined which is used for a cooling medium like water, which is flowing through the space defined between the copper-tube 22 and the backing-tube 20.

In addition to the function as a guide-tube for the cooling medium 23 the copper-tube 22 also serves as a magnet yoke for the magnet arrangements 24 disposed inside the copper-tube 22.

The cathode 11 shown in FIG. 4 comprises two magnet arrangements 24 or a double-magnet arrangement, respectively, with the magnet arrangements 24 being parts of the double-magnet arrangement. Each magnet arrangement 24 comprises a magnet yoke 26 as well as several permanent magnets 27, 28. The magnet yoke 26 is formed as an elongated plate, on which an outer ring of permanent magnets 27 is disposed. The permanent magnets 27 have all the same magnetic orientation. Within the ring of magnets 27, a row of magnets 28 is arranged. The magnets 28 have an anti-parallel magnetic orientation compared to the magnets 27. As a consequence of the design of the magnet arrangements 24, magnetic field lines penetrating the backing-tube 20 and the target 21 lead to a confinement of electrons in front of the target so that due to the high concentration of electrons, a large number of ions and therefore a plasma area 25 is produced.

The concentration of the plasma according to the magnet arrangement 24 is shown schematically in FIG. 4.

Due to the concentration of the plasma in the plasma areas 25, most of the atomized material is originating from areas of the target 21 opposing the plasma areas 25. In order to achieve a uniform material usage of the target material 21, the target 21 can be rotated around the axis 29 extending along the length direction of the cathode 11. Further, magnet arrangements 24 can also be rotated around the axis 29 in order to pivot the areas 25 of highest plasma concentration as well as highest sputter yield.

With the cathode 11 it is possible to simultaneously coat substrates 5 and 6 being disposed on opposing sides of the cathode 11 or the electrode arrangement 4, respectively, in which the cathode 11 is used. Accordingly, it is useful to simultaneously supply the substrates 5, 6 to the substrate positions where coating occurs.

Figure 5:
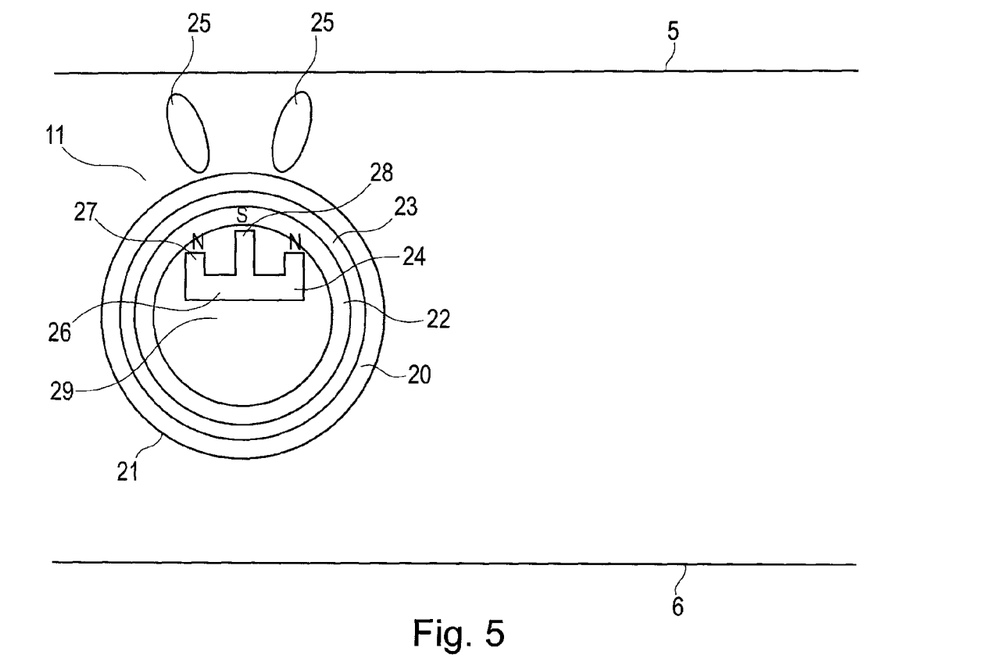
FIG. 5 another detailed illustration of a magnetron cathode similar to FIG. 4 according to a second embodiment.
Figure 6:
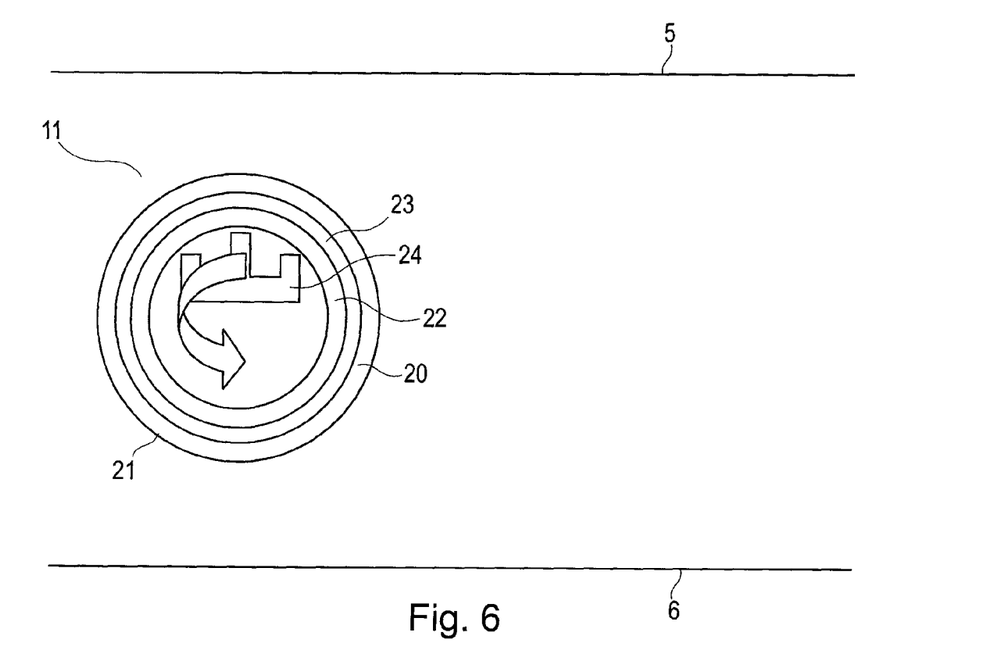
FIGS. 6 and 7 illustrations of different states of the cathode of FIG. 5 during operation.
Figure 7:
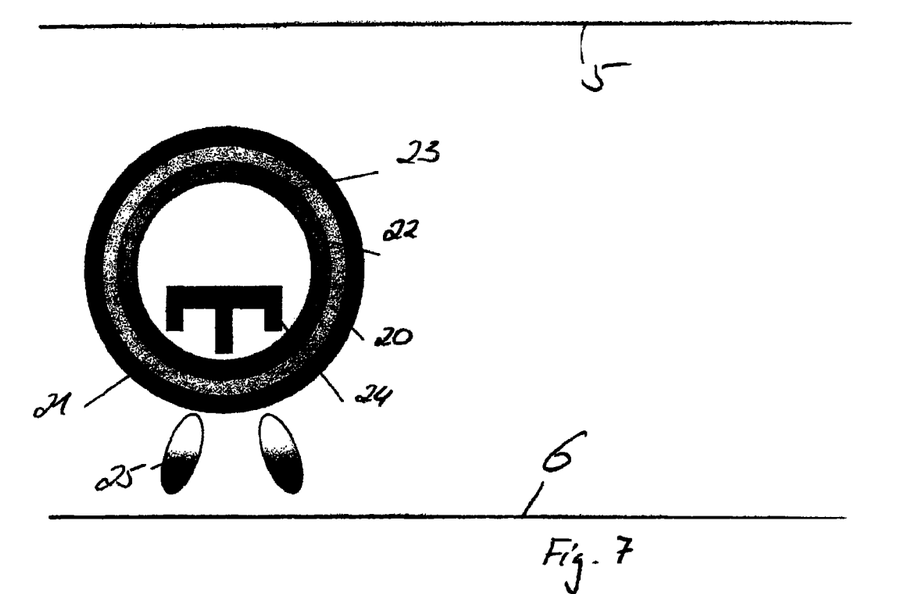

According to an alternative embodiment shown in FIG. 5 to 7 successive coating of substrates 5 and 6 may be performed.

The cathode 11 used in the embodiment shown in FIG. 5 to 7 differs from the embodiment shown in FIG. 4 only with respect to the magnet arrangements 24. While in the embodiment in FIG. 4 two magnet arrangements 24 or a double-magnet arrangement, respectively, are used, the cathode 11 of FIG. 5 comprises only one magnet arrangement 24. The magnet arrangement 24 of the embodiment of FIG. 5 is identical to one half of the double-magnet arrangement or one of the magnet arrangements 24 of FIG. 4. Magnet arrangement 24 of FIG. 5 comprises also a magnet yoke 26 in form of an elongated plate, on which a ring of magnets 27 at the margin of the magnet yoke 26 is arranged. In the centre of the ring, a row of magnets 28 having an anti-parallel magnetic orientation is again present.

The design of the magnet arrangement 24 of FIG. 5 leads to formation of plasma areas 25 with high sputter yield. However, since only one magnet arrangement 24 is disposed in cathode 11, no plasma areas 25 are generated at the opposing side of cathode 11 as this is the case for the embodiment shown in FIG. 4. Accordingly, coating of the substrates 5, 6 is only possible at that side of the cathode 11, where the plasma areas 25 are generated. In FIG. 5, substrate 5 can be coated, since the plasma areas 25 are present in the vicinity of substrate 5.

In order to allow also processing of substrate 6 being present in the second substrate position at the opposing side of cathode 11, the magnet arrangement 24 is rotated by 180° around the axis 29 (see FIG. 6). Accordingly, the plasma areas 25 are also rotated by 180° so as to face the substrate 6 in the second substrate position. Consequently, according to the position of the magnet arrangement 24 in FIG. 7, substrate 6 can now be coated.

FIG. 5 to 7 show that in the case that no simultaneous coating is required, only one magnet arrangement 24 is sufficient, since this asymmetric magnet arrangement with respect to the rotating axis 29 can be rotated or pivoted from the one substrate or coating position (substrate 5) to the other substrate or coating position (substrate 6) and vice versa.

During coating of one of the substrates 5, 6 the other substrate 5, 6 can be removed from the substrate position and a new substrate can be supplied. Thus, an effective usage of the equipment may be achieved.

In addition to the embodiments shown in FIGS. 4 to 7, additional modifications may be conceivable. For example, a double-magnet arrangement as shown in the embodiment of FIG. 4 may be used, wherein the parts of the double-magnet arrangement may be different to each other so as to form again an asymmetric magnet arrangement with respect to the rotation axis 29 (see asymmetric magnetic arrangements 1101, 1102 relative to rotation axis 1103 in FIG. 11) as in the embodiment of FIGS. 5 to 7.

Figure 11:
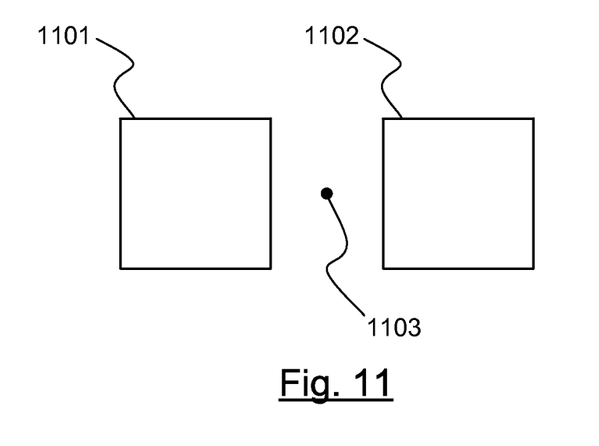
FIG. 11 is a block diagram representation of asymmetric magnets with respect to a rotation axis.

Such an asymmetric magnet arrangement can be used for simultaneous deposition of different layers on substrates in the various substrate positions. Especially, when the substrates are moved from one substrate position to the next substrate position, such a device may also be used in successively depositing different layers on a substrate.

For example, a first layer may be deposited in the substrate position indicated by the substrate 5 of FIG. 4 or 5.

After deposition of the first layer, the substrate may be move to the second substrate position indicated by the substrate 6 of FIG. 4 or 5, where with different magnetic field properties due the asymmetric magnet-arrangement a different, second layer can be deposited.

Although, the present invention is described in detail with respect to the embodiments, it is evident for a man skilled in the art, that the invention is not restricted to these embodiments, but modifications and amendments are possible, with respect to a different combination of all the features disclosed in the specification or by omitting one of the features of the embodiments without leaving the scope of the present invention which is defined by the attached claims. In particular, the present invention comprises all possible combinations of all claims, even if single claims are only referred to other single claims.

The invention claimed is:

1. Coating device for the deposition of thin films on large area substrates comprising:
   a process chamber;
   at least two coating positions within the process chamber where substrates are positioned to be coated, the coating positions comprising a first coating position and a second coating position,
   an electrode arrangement within the process chamber which is adapted for generating a first plasma adjacent to the electrode arrangement at a first side of the electrode arrangement and for generating a second plasma adjacent to the electrode arrangement at a second side of the electrode arrangement, the first side and the second side being at two opposing sides of the electrode arrangement,
   wherein the first coating position and the second coating position are on opposite sides of the electrode arrangement; and
   at least two substrate holders for supporting at least two substrates in the coating positions on opposing sides of the electrode arrangement, wherein the substrate holders are movable so that the substrate holders are adapted to be used for transporting the substrates in and out of the process chamber, the electrode arrangement being located between the coating positions and the substrates facing in the coating positions the at least two plasma generated at the two sides of the electrode arrangement,
   wherein the electrode arrangement comprises at least three cathodes including a first cathode, a second cathode, and at least a third cathode, wherein each of the first cathode, the second cathode, and the third cathode are rotatable about a rotation axis and rotatable from the first substrate position to the second substrate position and vice versa, wherein the rotation axis of each of the first cathode, the second cathode, and the third cathode are in a single plane, wherein the single plane is substantially parallel to the coating faces of the substrates to be coated and wherein the first cathode, the second cathode, and the third cathode extend at a constant distance to the substrates to be coated,
   wherein the distances between adjacent cathodes are not equal for all pairs of proximate cathodes of the first cathode, the second cathode, and the third cathode,
   wherein each cathode of the at least three cathodes being adapted to generate the first and second plasma at at least two sides of each cathode so that the first plasma of each of the cathodes is associated with the first coating position of the substrates and the second plasma of each of the cathodes is associated with the second coating position.

2. Coating device according to claim 1, wherein the electrode arrangement comprises an even number of cathodes arranged in a plane to be operated alternately as cathodes and anodes by one out of alternating voltage and pulsed voltage.

3. Coating device according to claim 1, wherein the cathodes have an elongated shape with the length being more than three times the extension in a direction across thereof.

4. Coating device according to claim 1, wherein the cathodes are arranged in parallel to each other along their length direction.

5. Coating device according to claim 1, wherein the distances between cathodes of outer pairs of proximate cathodes of the electrode arrangement being smaller than the distances between cathodes of inner pairs of cathodes of the electrode arrangement.

6. Coating device according to claim 1, wherein the cathodes are disposed movably within their plane of arrangement.

7. Coating device according to claim 1, wherein the cathodes are disposed slidably within their plane of arrangement.

8. Coating device according to claim 1, wherein the electrode arrangement comprises at least one anode.

9. Coating device according to claim 1, wherein a target material to be atomized is associated to each cathode.

10. Coating device according to claim 1, wherein at least one cathode is a magnetron electrode with at least one magnet arrangement being associated to the cathode.

11. Coating device according to claim 1, wherein at least one cathode comprises a rotatable cylindrical target.

12. Coating device according to claim 1, wherein at least one cathode comprises a rotatable magnet arrangement.

13. Coating device according to claim 1, wherein a cathode comprises at least two magnet arrangements, one for each plasma generating side of the cathode.

14. Coating device according to claim 1, wherein a cathode comprises at least two different magnet arrangements.

15. Coating device according to claim 1, wherein the substrate holders are kept stationary during the deposition process.

16. Coating device according to claim 1, wherein the substrate holders are prepared to receive substrates having an extension along at least one direction being greater than 1 m.

17. Coating device according to claim 1, wherein the electrode arrangement is positioned in the center of the process chamber, at least with respect to an axis connecting the substrate positions on opposing sides of the electrode arrangement.

18. Coating device according to claim 1, wherein the process chamber comprises a common gas supply for the deposition process of both substrates.

19. Coating device for the deposition of thin films on substrates comprising a process chamber,
an electrode arrangement within the process chamber which is adapted for generating a plasma adjacent to the electrode arrangement at a first coating position and a second coating position on opposite sides of the electrode arrangement; and
at least two substrate holders for supporting at least two substrates in substrate positions on opposing sides of the electrode arrangement,
wherein the substrate holders are movable so that the substrate holders are adapted to be used for transporting the substrates in and out of the process chamber, the electrode arrangement being located between the substrate positions and the substrates facing in the substrate positions the at least two plasma generated at the electrode arrangement,
wherein the electrode arrangement comprises at least three cathodes, wherein the at least three cathodes include a first cathode, a second cathode, and at least a third cathode, wherein each of the first cathode, the second cathode, and the third cathode are rotatable about a rotation axis and rotatable from the first substrate position to the second substrate position and vice versa, wherein the rotation axis of each of the first cathode, the second cathode, and the third cathode are in a single plane, wherein the single plane is substantially parallel to the coating faces of the substrates to be coated and wherein the first cathode, the second cathode, and the third cathode extend at a constant distance to the substrates to be coated, and
wherein the distances between adjacent cathodes being not equal for all pairs of proximate cathodes of the first cathode, the second cathode, and the third cathode.

20. Method for coating substrates with thin films comprising the following steps:
providing a process chamber,
providing an electrode arrangement within the process chamber for generating a plasma at a first coating position and a second coating position on opposite sides of the electrode arrangement adjacent to the electrode arrangement, and
providing at least two substrate holders for supporting at least a first and a second substrate,
locating the substrates to be coated in first and second positions on opposing sides of the electrode arrangement so that the electrode arrangement is located between the first and second positions and the substrates facing the at least two plasma generated at the electrode arrangement,
wherein the substrate holders are movable so that the substrate holders are adapted to be used for transporting the substrates in and out of the process chamber, and a first substrate located in the first substrate holder is coated in the first position during a first coating process and a second substrate supported by the second substrate holder is coated in the second position during a second coating process, the first and second coating process are carried out one after the other and wherein the electrode arrangement is provided with at least three cathodes including a first cathode, a second cathode and at least a third cathode, wherein each of the first cathode, the second cathode, and the third cathode are rotatable about a rotation axis and rotatable from the first coating position to the second coating position and vice versa, with at least one cathode being a magnetron electrode with at least one rotatable magnet arrangement being associated to the cathode, wherein the rotation axis of each of the first cathode, the second cathode, and the third cathode are in a single plane, wherein the single plane is substantially parallel to the coating faces of the substrates to be coated and wherein the first cathode, the second cathode, and the third cathode extend at a constant distance to the substrates to be coated, and
wherein the distances between adjacent cathodes are not equal for all pairs of proximate cathodes of the first cathode, the second cathode, and the third cathode.

21. Method according to claim 20, wherein during the first coating process the second substrate is moved into the second position or removed from the second position.

22. Method according to claim 20, wherein the magnet arrangement being pivoted between the at least two positions during first and second coating processes.

23. Coating device according to claim 20, wherein during the second coating process the first substrate is moved into the first position or removed from the first position.

* * * * *